(12) United States Patent
Chen

(10) Patent No.: US 8,406,067 B2
(45) Date of Patent: Mar. 26, 2013

(54) SEMICONDUCTOR MEMORY DEVICE

(75) Inventor: Chung-Zen Chen, Hsinchu (TW)

(73) Assignee: Elite Semiconductor Memory Technology Inc., Hsinchu (TW)

( * ) Notice: Subject to any disclaimer, the term of this patent is extended or adjusted under 35 U.S.C. 154(b) by 109 days.

(21) Appl. No.: 13/187,548

(22) Filed: Jul. 21, 2011

(65) Prior Publication Data

US 2013/0021855 A1    Jan. 24, 2013

(51) Int. Cl.
*G11C 16/04*    (2006.01)
(52) U.S. Cl. .................... 365/189.07; 365/205; 365/207; 365/189.09
(58) Field of Classification Search ............. 365/189.07, 365/205, 207, 189.09
See application file for complete search history.

(56) References Cited

U.S. PATENT DOCUMENTS

| | | | |
|---|---|---|---|
| 6,567,330 B2 | 5/2003 | Fujita et al. | |
| 6,914,836 B2 | 7/2005 | Jeon et al. | |
| 8,125,837 B2 * | 2/2012 | Yamaoka et al. | 365/189.07 |

* cited by examiner

*Primary Examiner* — David Lam
(74) *Attorney, Agent, or Firm* — Jianq Chyun IP Office

(57) ABSTRACT

The present invention provides a semiconductor memory device, the voltage divider circuit comprises a data line sense amplifier and an input output data sensing circuit. The data line sense amplifier receives a data line signal pair and senses the data line signal pair in a first timing period to generate a first output data and a second output data, wherein, the first output data and the second output data are complementary. The input output data sensing circuit receives at least one reference output data and one of the first and the second output data. The input output data sensing circuit generates a sensed data by comparing voltage levels of the reference output data and the one of the first and the second output data in a second timing period, wherein the voltage level of the reference output data is a pre-determined voltage level.

12 Claims, 4 Drawing Sheets

SEMICONDUCTOR MEMORY DEVICE

BACKGROUND OF THE INVENTION

1. Field of Invention

The present invention generally relates to a semiconductor memory device, and more particularly to a dynamic random access semiconductor memory device.

2. Description of Prior Art

In an electrical device at the present, semiconductor memory is one of the most important devices in the electrical device. Please referring to FIG. 1, FIG. 1 is a waveform for reading data from a dynamic random access memory in prior art. The dynamic random access memory is a synchronous dynamic random access memory (SDRAM) and operating according to the system clock XCLK. A clock signal CLKP is fed to a sense amplifier controller of the SDRAM, and the sense amplifier controller generates a signal SAC-SET to enable a data line sense amplifier of the SDRAM. Data signals IO and ION are both transported to an input output sense amplifier through the data line sense amplifier of the SDRAM when the signal SAC-SET is enabled. At the same time, as shown is FIG. 1, the voltage level of the data signal ION is getting lower when the signal SAC-SET is enabled (in logical high level). The input output sense amplifier of the SDRAM compares the voltage levels of the data signals IO and ION, and a sensed data is generated according to the comparison result when a clock signal CLKN is in logical high level.

Please notice here, a timing period for comparing the voltage levels of the data signals IO and ION is negative proportion to the frequency of the system clock XCLK. That is, the voltage drop of the data signal ION may be not enough for providing the input output sense amplifier to sense a correct result before the clock signal CLKN turned to disable (in logical low level). The operating speed of the SDRAM is limited, and the efficiency of a system which the SDRAM belongs to is reduced. Furthermore, there are two data signals IO and ION are needed in the prior art shown in FIG. 1, such as that the area of the circuit is large and the cost of the SDRAM is increased.

SUMMARY OF THE INVENTION

The present invention provides a semiconductor memory device for reducing the size of the circuit and increasing the operating speed.

The present invention provides a semiconductor memory device, the voltage divider circuit comprises a data line sense amplifier and an input output data sensing circuit. The data line sense amplifier coupled to a bit line selecting circuit of the semiconductor memory device. The data line sense amplifier receives a data line signal pair and senses the data line signal pair in a first timing period to generate a first output data and a second output data, wherein, the first output data and the second output data are complementary. The input output data sensing circuit coupled to the data line sense amplifier. The input output data sensing circuit receives at least one reference output data and one of the first and the second output data. The input output data sensing circuit generates a sensed data by comparing voltage levels of the reference output data and the one of the first and the second output data in a second timing period, wherein the voltage level of the reference output data is a pre-determined voltage level.

Accordingly, the semiconductor memory device provided by the present invention compares one of the first and the second output data with at least one predetermined reference output data for sense a logical level of the data read from corresponding memory cell. That is, the necessary sensing time of the semiconductor memory device can be reduced and the number of the data signal lines can be reduced, too.

It is to be understood that both the foregoing general description and the following detailed description are exemplary, and are intended to provide further explanation of the invention as claimed.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

DESCRIPTION OF THE EMBODIMENTS

Figure 1:
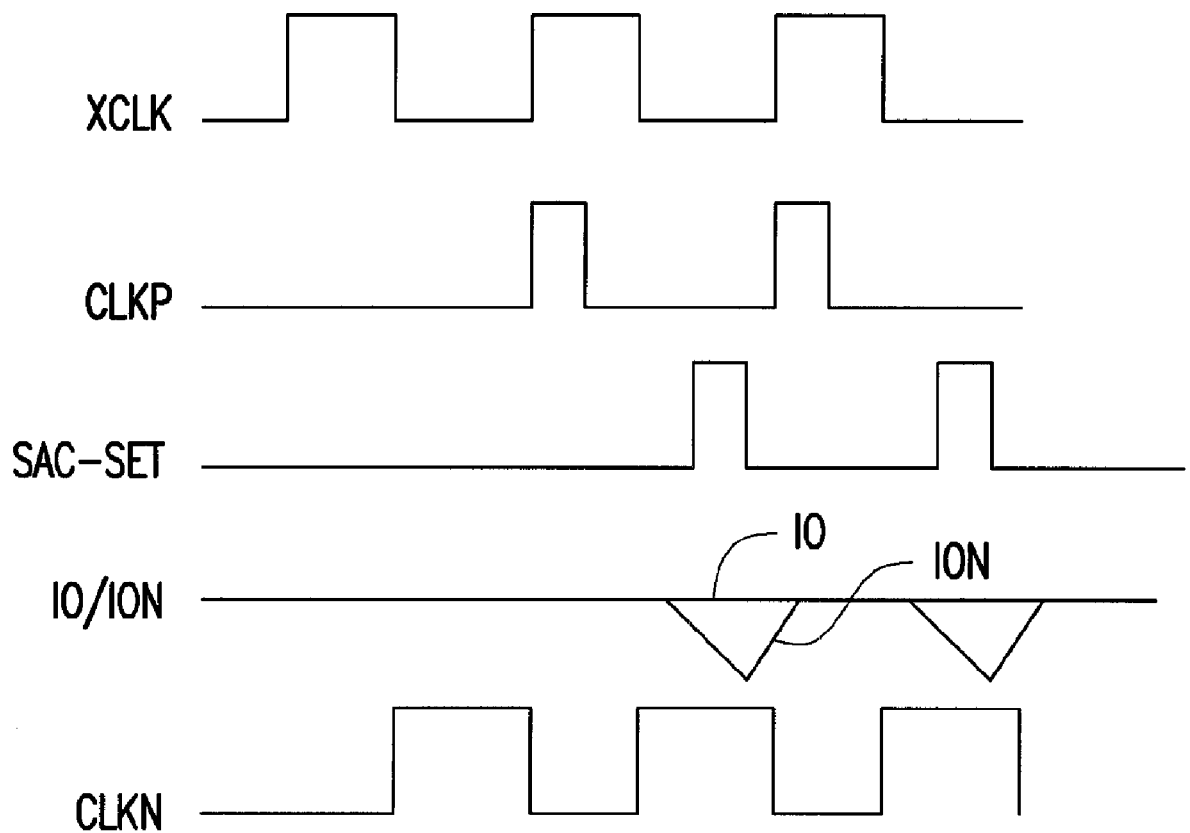
FIG. 1 is a waveform for reading data from a dynamic random access memory in prior art.

Reference will now be made in detail to the present preferred embodiment of the invention, examples of which are illustrated in the accompanying drawings. Wherever possible, the same reference numbers are used in the drawings and the description to refer to the same or like parts.

Figure 2:
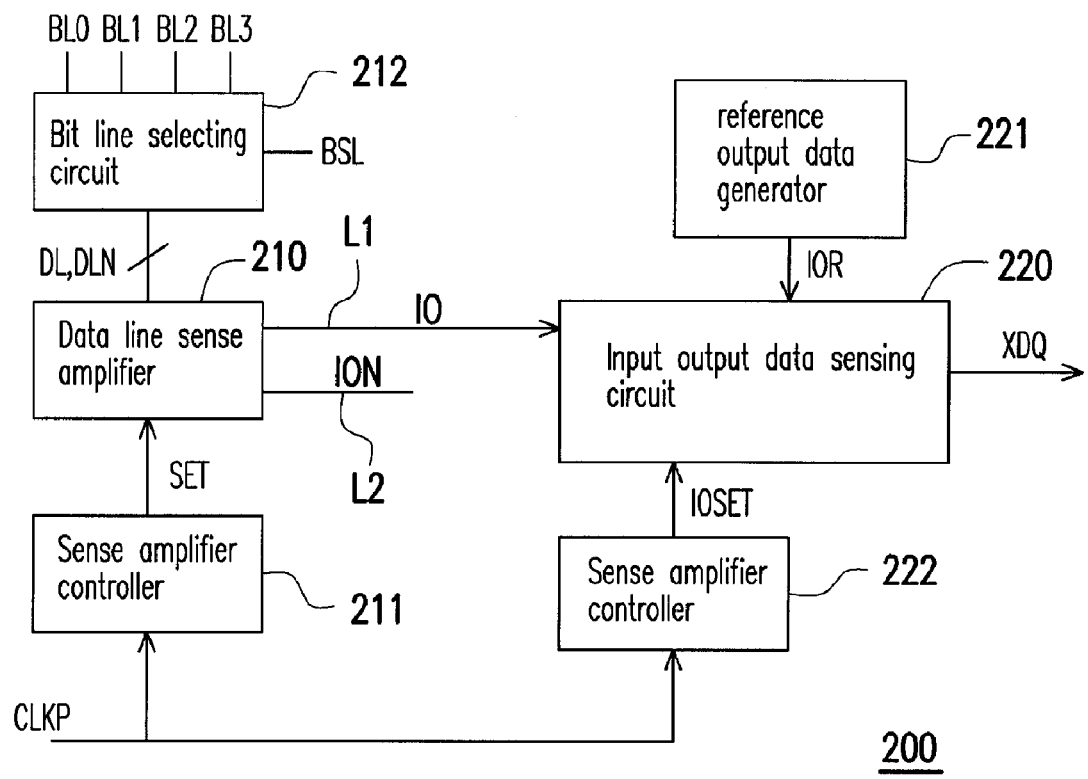
FIG. 2 is a block diagram of a semiconductor memory device according to an embodiment of the present invention.

Referring to FIG. 2, FIG. 2 is a block diagram of a semiconductor memory device according to an embodiment of the present invention. The semiconductor memory device 200 includes a data line sense amplifier 210, a sense amplifier controller 211, a bit line selecting circuit 212, an input output data sensing circuit 220, a reference output data generator, and a sense amplifier controller 222. The data line sense amplifier 210 coupled to the bit line selecting circuit 212 of the semiconductor memory device 200. The data line sense amplifier 210 receives a data line signal pair DL and DLN from the bit line selecting circuit 212, and the data line sense amplifier 210 is used to sense the data line signal pair DL and DLN in a first timing period for generating output data 10 and ION. Wherein, logical levels of the output data 10 and the output data ION are complementary.

The bit line selecting circuit 212 connected to a plurality of bit line pairs BL0~BL3 of the semiconductor memory device 200. The bit line selecting circuit 212 further receives bit line selecting signal BSL. The bit line selecting circuit 212 selects a signal pair from one of the bit line pairs BL0~BL3 to generate the data line signal pair DL and DLN according to the bit line selecting signal BSL.

The sense amplifier controller 211 coupled to the data line sense amplifier 210. The sense amplifier controller 211 receives a clock signal CLKP and generates a sensing enable signal SET during the first timing period according to the clock signal CLKP. Please notice here, the sense amplifier controller 211 generates a sensing enable signal SET during the first timing period when the semiconductor memory device receives a data read request. For example, in the first timing period, the sensing enable signal SET is held on the logical high level.

In the other hand, when the sensing enable signal SET is enabled, the data line signal pair DL and DLN is transported to signals lines L1 and L2 of the data line sense amplifier 210. For the data line signal DL and DLN are complementary, one of the output data IO and ION on the signals lines L1 and L2 separately is varied from a first reference voltage level to a second reference voltage level. Wherein, in this embodiment, the first reference voltage level is equal to the voltage level of an operating voltage of the semiconductor memory device 200, and the second reference voltage level is equal to the ground voltage. That is, the first reference voltage level is larger than the second voltage level.

The input output data sensing circuit 220 coupled to the data line sense amplifier 210. The input output data sensing circuit 220 receives one of the output data IO and ION from the data line sense amplifier 210. The input output data sensing circuit 220 also receives at least one reference output data IOR from the reference output data generator 221, and the input output data sensing circuit 220 receives a sensing enable signal IOSET from the sense amplifier controller 222.

The sense amplifier controller 222 receives the clock signal CLKP and enables the sensing enable signal IOSET in the second timing period. For example, in the second timing period, the sensing enable signal IOSET is held on logical high level. Furthermore, when the sensing enable signal IOSET is held on logical high level, the input output data sensing circuit 220 compares the voltage levels of the output data IO and the reference output data IOR and generates a sensed data XDO accordingly. Specifically, if the input output data sensing circuit 220 detects the voltage level of the output data IO is larger than the reference output data IOR, the input output data sensing circuit 220 generates the sensed data XDQ with logical high level, for example. On the contrary, if the input output data sensing circuit 220 detects the voltage level of the output data IO is less than the reference output data IOR, the input output data sensing circuit 220 generates the sensed data XDQ with logical low level, for example.

The input output data sensing circuit 220 can also compare the voltage level of the output data ION with the reference output data IOR. If the input output data sensing circuit 220 detects the voltage level of the output data ION is less than the reference output data IOR, the input output data sensing circuit 220 generates the sensed data XDQ with logical high level. In the other hand, if the input output data sensing circuit 220 detects the voltage level of the output data ION is larger than the reference output data IOR, the input output data sensing circuit 220 generates the sensed data XDQ with logical low level, for example.

For example, if the voltage levels of the first and the second output data are varied between a first reference voltage level V1 and a second reference voltage level V2, the voltage level of the reference output data IOR1 can be set to equal to $(V1-V2)*N1+V2$. Wherein, the first reference voltage level V1 is larger than the second reference voltage level V2, N1 is a real number and smaller than 1.

In the embodiment, the second reference voltage level V2 can be equal to 0V (ground voltage), and N1 can be set to 0.9 or 0.8. That is, when the input output data sensing circuit 220 detects the voltage level of the output data IO is larger than the reference output data IOR ($=0.9*V1$ or $0.8*V1$), the input output data sensing circuit 220 generates the sensed data XDQ with logical high level. In the other hand, if the input output data sensing circuit 220 detects the voltage level of the output data IO is less than the reference output data IOR ($=0.8*V1$ or $0.9*V1$), the input output data sensing circuit 220 generates the sensed data XDQ with logical low level.

Figure 3:
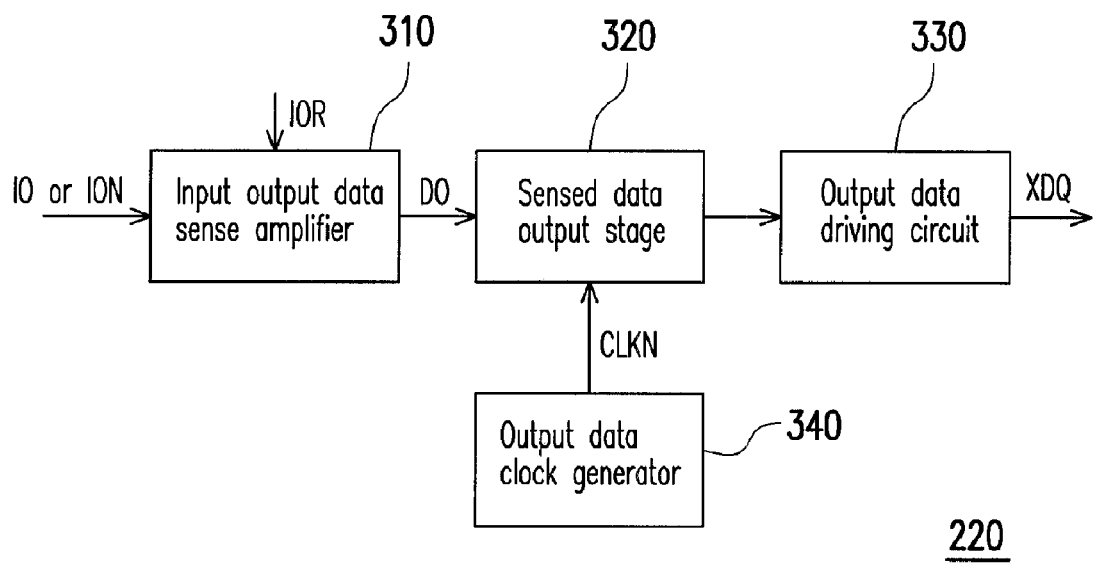
FIG. 3 is a block diagram of the input output data sensing circuit according to an embodiment of the present invention.

Referring to FIG. 3, FIG. 3 is a block diagram of the input output data sensing circuit according to an embodiment of the present invention. The input output data sensing circuit 220 includes an input output data sensing amplifier 310, a sense data output stage 320, an output data driving circuit 330 and an output data clock generator 340.

The input output data sense amplifier 310 is used for sensing the reference output data IOR and one of the first and the second output data IO and ION in the second timing period. The sensed data output stage 320 coupled the input output data sense amplifier 310. The sensed data output stage 320 output the sensing result DO of the input output data sense amplifier 310 according to a second clock signal CLKN. Further, the output data clock generator 340 coupled to the sensed data output stage 320 and the output data clock generator 340 is used to generate the clock signal CLKN. The output data driving circuit 330 is coupled to the sense data output stage 320 for receiving the sensing result DO through the sensed data output stage 320. The output data driving circuit 330 is used for enhancing a current driving ability of the sensing result DO and generating the sensed data XDO.

Figure 4:
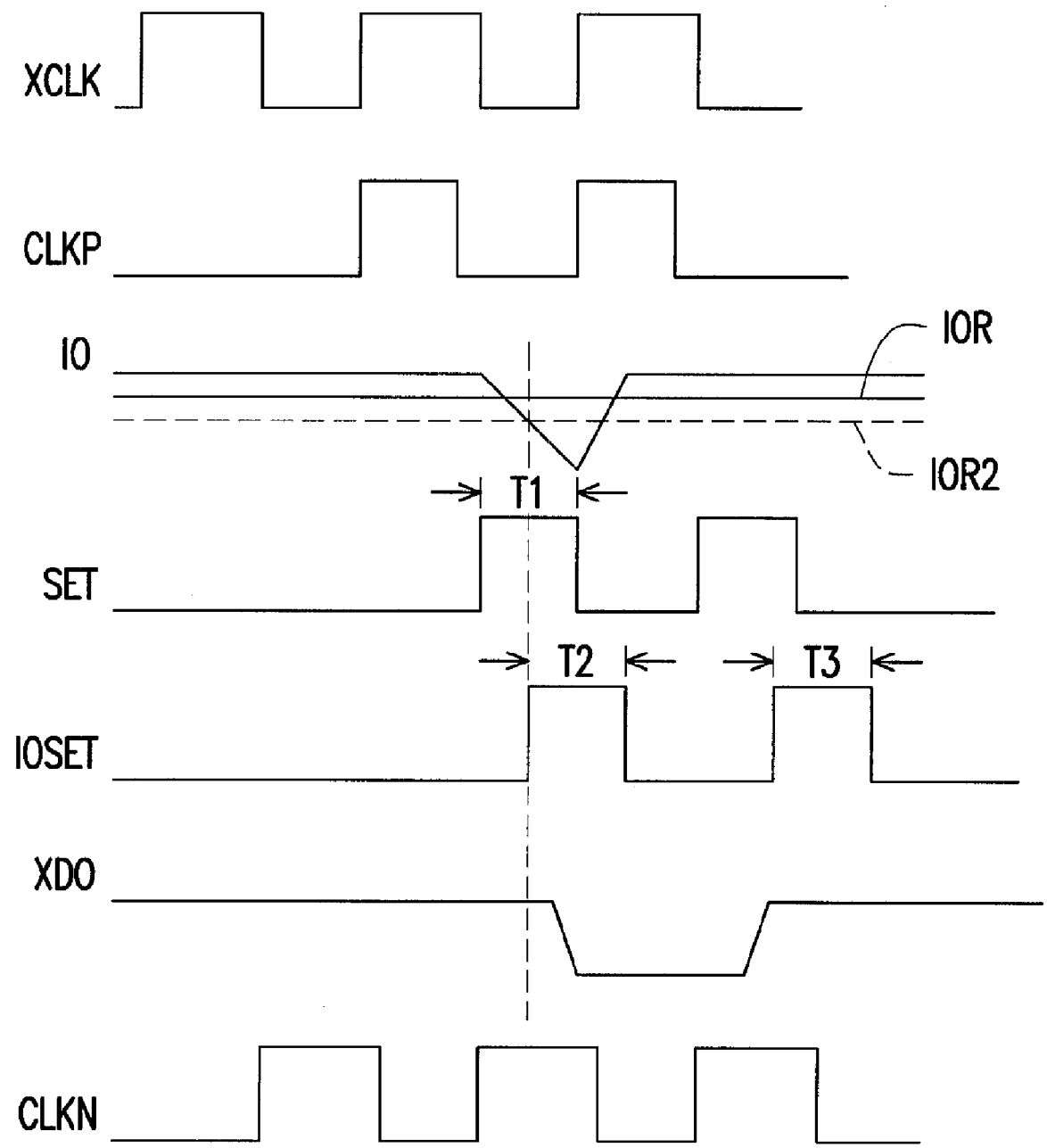
FIG. 4 is a waveform of a semiconductor memory device according to an embodiment of the present invention.

Referring to FIG. 4, FIG. 4 is a waveform of a semiconductor memory device according to an embodiment of the present invention. During the first timing period T1, the enable signal SET is enabled and the data output data IO is generated (reduced). In the second timing period T2, when the voltage level of the data output data IO is not larger than a reference value IOR2, the enable signal IOSET is enabled, and the input output data sensing circuit compares the voltage level of the data output data IO with the reference output data IOR to generate the sensed data XDO. In the illustration of FIG. 4, the voltage level of the data output data IO reduced to lower than the reference output data IOR during the second timing period T2. That is, the voltage level of the sensed data XDO is set to logical low level. Please notice here, during the other second timing period T3, the voltage level of the data output data IO raise to higher than the reference output data IOR. Therefore, the voltage level of the sensed data XDO is changed to logical high level correspondingly.

Figure 5A:
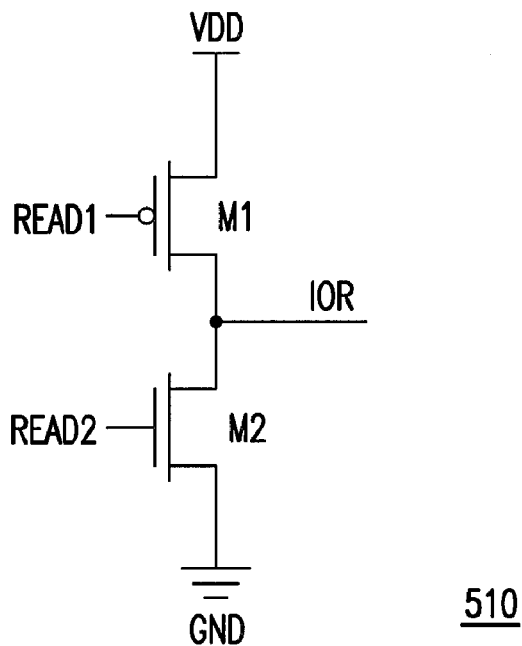
FIGS. 5A and 5B are circuit diagrams of reference output data generators separately according to an embodiment of the present invention.
Figure 5B:
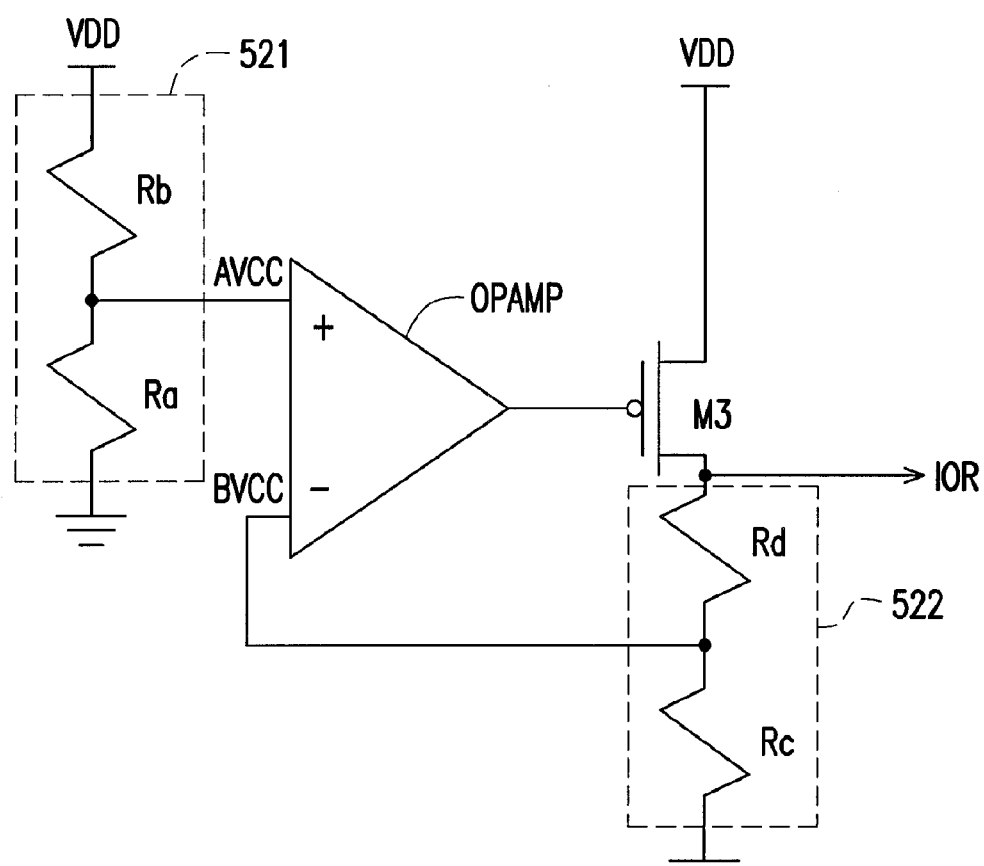

Referring to FIGS. 5A and 5B, FIGS. 5A and 5B are circuit diagrams of reference output data generators separately according to an embodiment of the present invention.

Firstly, referring to FIG. 5A, the reference output data generator 510 includes a transistor M1 and a transistor M2. The transistor M1 having a first terminal, a second terminal and a control terminal. The first terminal of the transistor M1 coupled to an operating voltage VDD and the control terminal of the transistor M1 receives a memory read signal READ1. The transistor M2 having a first terminal, a second terminal and a control terminal, and the first terminal of the transistor M2 coupled to the second terminal of the transistor M1, the second terminal of the transistor M2 coupled to the ground voltage GND, and the control terminal of the transistor M2 receives the memory read signal READ2. The reference output data IOR is generated at the connection terminal of the transistor M1 and M2. The voltage level of the reference output data IOR is determined the operating voltage VDD, the ground GND, and the resistances of the transistor M1 and M2.

The resistances of the transistor M1 and M2 can be determined by the voltage level of memory read signal READ1 and READ2 respectively. Moreover, the resistances of the transistor M1 and M2 can be also determined by changing the width-length ratios of the transistor M1 and M2.

Secondly, referring to FIG. 5B, the reference output data generator 520 includes resistor strings 521 and 522, an operation amplifier OPAMP and a transistor M3. The resistor string 521 receives and divides the operating voltage VDD to generate a first voltage AVCC. The resistor string 522 receives and divides the reference output data IOR to generate the second voltage BVCC. For the voltage levels of the first and the second voltage AVCC and BVCC are equaled, the voltage level of the reference output data IOR can be obtained by formula (I) shown as below:

$$IOR=(Rd+Rc)/Rc \times Ra/(Ra+Rb) \times VDD \quad (1)$$

That is, if the voltage level of the reference output data IOR is set to equal to 0.9 VDD, the resistances of resistor Ra and Rb are equaled, and the resistance of resistor Rd equal to 0.8 times the resistance of resistor Rc.

To sum up, in the embodiment of the invention, the input output data sensing circuit compares the predetermined reference output data and one of the output data to generate the sensed data. That is, only one output data is necessary for input output data sensing circuit and the area of the circuit is reduced. Moreover, the reference output data can be predetermined by the designer of the semiconductor memory device according to the operating speed of the semiconductor memory device. The accuracy of the sense data is improved.

Although the invention has been described with reference to the above embodiments, it is apparent to one of the ordinary skill in the art that modifications to the described embodiments may be made without departing from the spirit of the invention. Accordingly, the scope of the invention will be defined by the attached claims not by the above detailed descriptions.

What is claimed is:

1. A semiconductor memory device, comprising:
    a data line sense amplifier, coupled to a bit line selecting circuit of the semiconductor memory device, the data line sense amplifier receives a data line signal pair and senses the data line signal pair in a first timing period to generate a first output data and a second output data, wherein the first output data and the second output data are complementary; and
    an input output data sensing circuit, coupled to the data line sense amplifier, the input output data sensing circuit receives at least one reference output data and one of the first and the second output data, the input output data sensing circuit generates a sensed data by comparing voltage levels of the reference output data and the one of the first and the second output data in a second timing period, wherein the voltage level of the reference output data is a pre-determined voltage level.

2. The semiconductor memory device according to claim 1, wherein the voltage levels of the first and the second output data are varied between a first reference voltage level and a second reference voltage level, and the first reference voltage level is larger than the second voltage level.

3. The semiconductor memory device according to claim 2, wherein the reference output data comprises a reference output data, the voltage level of the reference output data is equal to (the first reference voltage level−the second reference voltage level)*N1+the second reference voltage level, wherein N1 is a real number and N1 is smaller than 1.

4. The semiconductor memory device according to claim 3, N1 is equal to 0.9 or 0.8.

5. The semiconductor memory device according to claim 1, further comprising:
    a reference output data generator, coupled to the input output data sensing circuit, for generating and providing the reference output data to the input output data sensing circuit.

6. The semiconductor memory device according to claim 5, wherein the reference output data generator comprises:
    a first transistor, having a first terminal, a second terminal and a control terminal, the first terminal coupled to an operating voltage and the control terminal of the first transistor receives a memory read signal; and
    a second transistor, having a first terminal, a second terminal and a control terminal, and the first terminal coupled to the second terminal of the first transistor, the second terminal of the second transistor coupled to a ground voltage, and the control terminal of the second transistor receives the memory read signal,
    wherein, the first transistor generates the reference output data according to the operating voltage and the ground voltage on the second terminal thereof.

7. The semiconductor memory device according to claim 5, wherein the reference output data generator comprises:
    a first resistor string, receiving and dividing an operating voltage to generate a first voltage;
    an operation amplifier, having a first and a second input terminal and an output terminal, the first input terminal and the second input terminal receive the first voltage and a second voltage separately;
    a transistor, having a first terminal, a second terminal and a control terminal, the first terminal of the transistor receives the operating voltage, the control terminal of the transistor coupled to the output terminal of the operation amplifier; and
    a second resistor string, coupled between the second terminal of the transistor and a ground voltage, the second resistor string further coupled to the second input terminal of the operation amplifier, and provides the second voltage to the operation amplifier.

8. The semiconductor memory device according to claim 1, further comprising:
    a first sense amplifier controller, coupled to the data line sense amplifier, the first sense amplifier controller receives a first clock signal and generates a first sensing enable signal during the first timing period.

9. The semiconductor memory device according to claim 8, further comprising:
    a second sense amplifier controller, coupled to the input output data sensing circuit, the second sense amplifier controller receives the first clock signal and generates a second sensing enable signal during the second timing period.

10. The semiconductor memory device according to claim 1, wherein the input output data sensing circuit further comprises:
    an input output data sense amplifier, sensing the reference output data and one of the first and the second output data in the second timing period; and
    a sensed data output stage, coupled the input output data sense amplifier, the sensed data output stage output the sensing result of the input output data sense amplifier according to a second clock signal.

11. The semiconductor memory device according to claim 10, wherein the input output data sensing circuit further comprises:
    an output data clock generator, coupled to the sensed data output stage, the output data clock generator is used to generate the second clock signal.

12. The semiconductor memory device according to claim 10, wherein the input output data sensing circuit further comprises:
    an output data driving circuit, coupled to the sensed data output stage, the output data driving circuit is used to receive and enhance a current driving ability of the sensing result for outputting the sensed data.

* * * * *